United States Patent
Priel et al.

(10) Patent No.: US 9,000,804 B2
(45) Date of Patent: Apr. 7, 2015

(54) INTEGRATED CIRCUIT DEVICE COMPRISING CLOCK GATING CIRCUITRY, ELECTRONIC DEVICE AND METHOD FOR DYNAMICALLY CONFIGURING CLOCK GATING

(75) Inventors: Michael Priel, Hertzella (IL); Ilan Kapilushnik, Hod Hasharon (IL); Dan Kuzmin, Givat Shmuel (IL)

(73) Assignee: Freescale Semiconductor, Inc., Austin, TX (US)

( * ) Notice: Subject to any disclaimer, the term of this patent is extended or adjusted under 35 U.S.C. 154(b) by 224 days.

(21) Appl. No.: 13/580,583

(22) PCT Filed: Mar. 3, 2010

(86) PCT No.: PCT/IB2010/050915
§ 371 (c)(1),
(2), (4) Date: Aug. 22, 2012

(87) PCT Pub. No.: WO2011/107828
PCT Pub. Date: Sep. 9, 2011

(65) Prior Publication Data
US 2012/0319731 A1    Dec. 20, 2012

(51) Int. Cl.
*H03K 19/00* (2006.01)
*G06F 1/32* (2006.01)

(52) U.S. Cl.
CPC .......... *H03K 19/0016* (2013.01); *G06F 1/3237* (2013.01)

(58) Field of Classification Search
None
See application file for complete search history.

(56) References Cited

U.S. PATENT DOCUMENTS

| | | |
|---|---|---|
| 5,452,239 A | 9/1995 | Dai et al. |
| 7,080,334 B2 | 7/2006 | Fan et al. |
| 7,089,438 B2 | 8/2006 | Raad |
| 7,159,134 B2 | 1/2007 | Soerensen et al. |
| 7,490,257 B2 | 2/2009 | Endo |
| 7,546,559 B2 | 6/2009 | Kapoor et al. |
| 2003/0062949 A1 | 4/2003 | Suzuki |
| 2003/0218480 A1 | 11/2003 | Swami et al. |
| 2007/0210833 A1* | 9/2007 | Hamdan et al. .............. 326/93 |

FOREIGN PATENT DOCUMENTS

JP   2002-314839 A   10/2002

OTHER PUBLICATIONS

International Search Report and Written Opinion correlating to PCT/IB2010/050915 dated Nov. 26, 2010.

\* cited by examiner

*Primary Examiner* — Jany Richardson

(57) ABSTRACT

An integrated circuit comprises clock gating circuitry comprising at least one gating component located within a clock distribution network and arranged to enable at least one part of the clock distribution network to be gated, and gating control circuitry arranged to cause the at least one gating component to disable the at least one part of the clock distribution network upon certain conditions being fulfilled. The clock gating circuitry further comprises clock gating disabling circuitry configurable to enable the gating of the at least one part of the clock distribution network to be disabled.

20 Claims, 3 Drawing Sheets

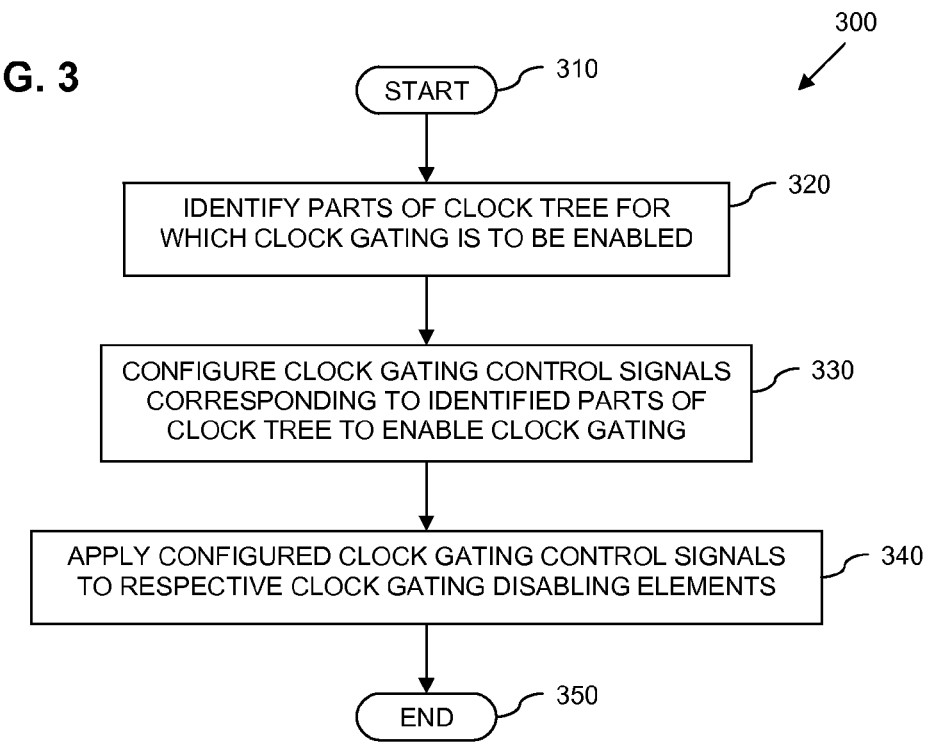
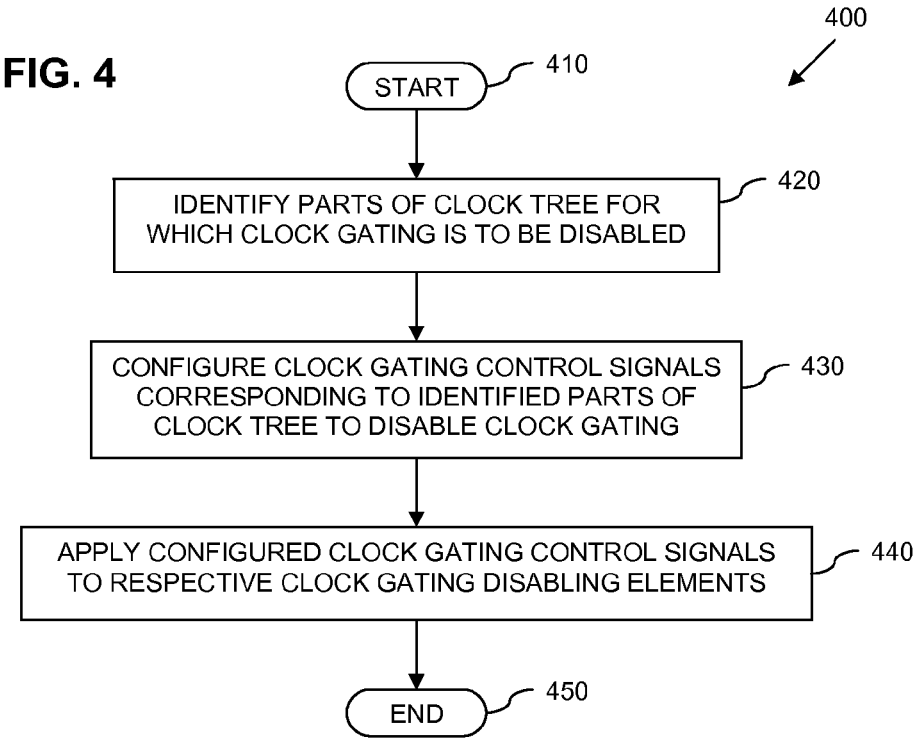

INTEGRATED CIRCUIT DEVICE COMPRISING CLOCK GATING CIRCUITRY, ELECTRONIC DEVICE AND METHOD FOR DYNAMICALLY CONFIGURING CLOCK GATING

FIELD OF THE INVENTION

The field of this invention relates an integrated circuit device comprising clock gating circuitry, an electronic device and a method for dynamically configuring clock gating.

BACKGROUND OF THE INVENTION

In the field of electronic devices, and in particular the field of synchronous digital systems, it is known for a clock signal to be used to define a time reference for a transition of states within functional elements of such synchronous digital systems. As such it is known to implement a clock distribution network, sometimes referred to as a clock tree when comprising a general tree-like form, which typically receives one or more clock signals as inputs, and distributes the received clock signal(s) to functional elements within the synchronous digital system.

Such clock distribution networks often comprise a significant 'fan-out', and operate at extremely high speeds. Furthermore, the clock waveforms are required to be particularly clean and sharp, since they provide a temporal reference to the rest of the synchronous digital system. As a result, clock distribution networks are particularly affected by technology scaling, in that long interconnect lines become significantly more resistive as line dimensions are decreased. Consequently, clock distribution networks have a significant impact on the maximum performance of an entire synchronous digital system.

Furthermore, a clock distribution network often takes a significant fraction of the power consumed by an integrated circuit (IC) device in which it is implemented. It is known to implement clock gating as a basic power saving technique. The technique of clock gating typically comprises 'gating' portions of an IC's clock distribution network relating to parts of the IC that are not required to be clocked under certain operating conditions. In this manner, when such a part of the IC is not required to be clocked, the part of the clock distribution network relating to that part of the IC may be 'gated off', in order to disable the clock signal to that part of the IC, thereby stopping further data/signal bit transitions and saving power. More effective clock gating, such that may provide greater power savings, may be achieved by providing the clock gating earlier in the clock distribution network.

A problem with the concept of clock gating is that setup timing violations result in an inherent latency between a decision to 'wake-up' a part of an IC device for which a part of the clock distribution network has been 'gated off', and achieving the re-initialisation of that part of the clock distribution network and the waking up of the corresponding part of the IC device. Such latency has a detrimental impact on the achievable operating frequency of the circuit in which it is implemented. Such a detrimental impact on the achievable operating frequency of the circuit is especially significant for high speed circuit designs and systems. For example, a signal processing system that was shown to be able to operate at 1.2 Ghz without clock gating may be reduced to only being able to operate at around 1050 MHz when clock gating is implemented, due to setup timing violations of, say, approximately 120 ps using current circuit design techniques.

SUMMARY OF THE INVENTION

The present invention provides an integrated circuit device comprising a clock gating circuit, an electronic circuit device and a method for dynamically configuring clock gating as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIGS. 3 and 4 illustrate an example of a simplified flow-chart of a method for dynamically configuring clock gating.

DETAILED DESCRIPTION

The present invention will now be described in terms of a clock distribution network comprising clock gating within an integrated circuit device. However, the present invention is not limited to such an implementation, and it is envisaged that the present invention may equally be implemented within any clock distribution network comprising clock gating and therefore not limited to a single integrated circuit device.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
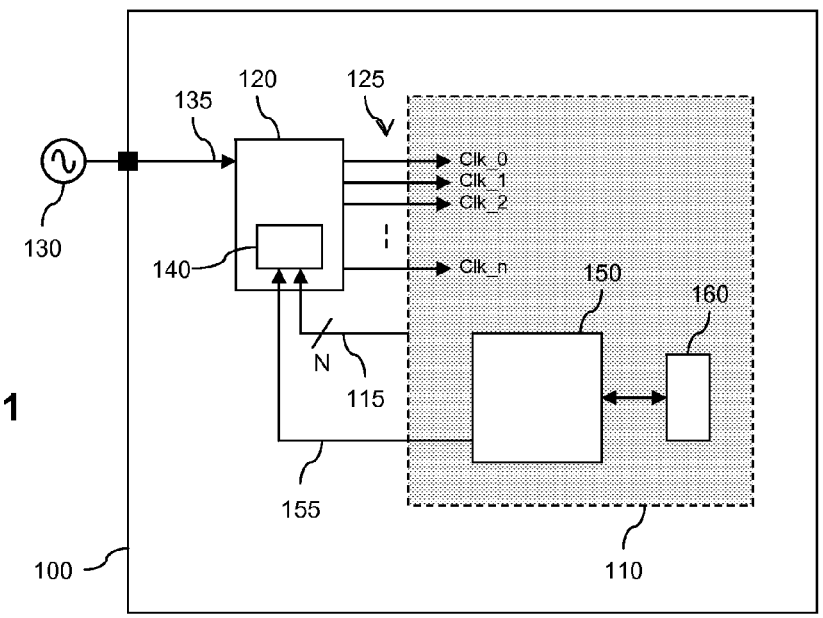
FIG. 1 illustrates an example of an integrated circuit device comprising a clock distribution network.

Referring now to FIG. 1, there is illustrated an example integrated circuit device 100 comprising a clock distribution network, illustrated generally at 120. It is known for a clock signal to be used to define a time reference for a transition of states within functional elements of, say, synchronous digital systems. As such it is known to implement a clock distribution network, sometimes referred to as a clock tree when comprising a general tree-like form, which typically receives one or more clock signals as inputs and distributes the received one or more clock signal(s) to functional elements within the synchronous digital system. Accordingly, for the illustrated example the clock distribution network 120 is arranged to receive a primary clock signal 135 provided by an external timing source 130, and to 'distribute' a plurality of derivative clock signals illustrated generally at 125 to functional elements within functional block 110 of the integrated circuit device 100. The clock distribution network 120 may further be arranged to provide derivative clock signals (not shown) to functional elements external to the integrated circuit device 100.

The clock distribution network 120 comprises clock gating circuitry 140 arranged to 'gate' portions of the clock distribution network relating to functional elements that are not required to be clocked under certain operating conditions. In this manner, when such functional elements are not required to be clocked, the relevant parts of the clock distribution network may be 'gated off', or 'disabled', to disable the clock signal to those functional elements, thereby stopping further data/signal bit transitions and saving power. In particular, the clock gating circuitry comprises one or more gating components located within the clock distribution network 120 and arranged to enable one or more parts of the clock distribution network 120 to be gated.

Figure 2:
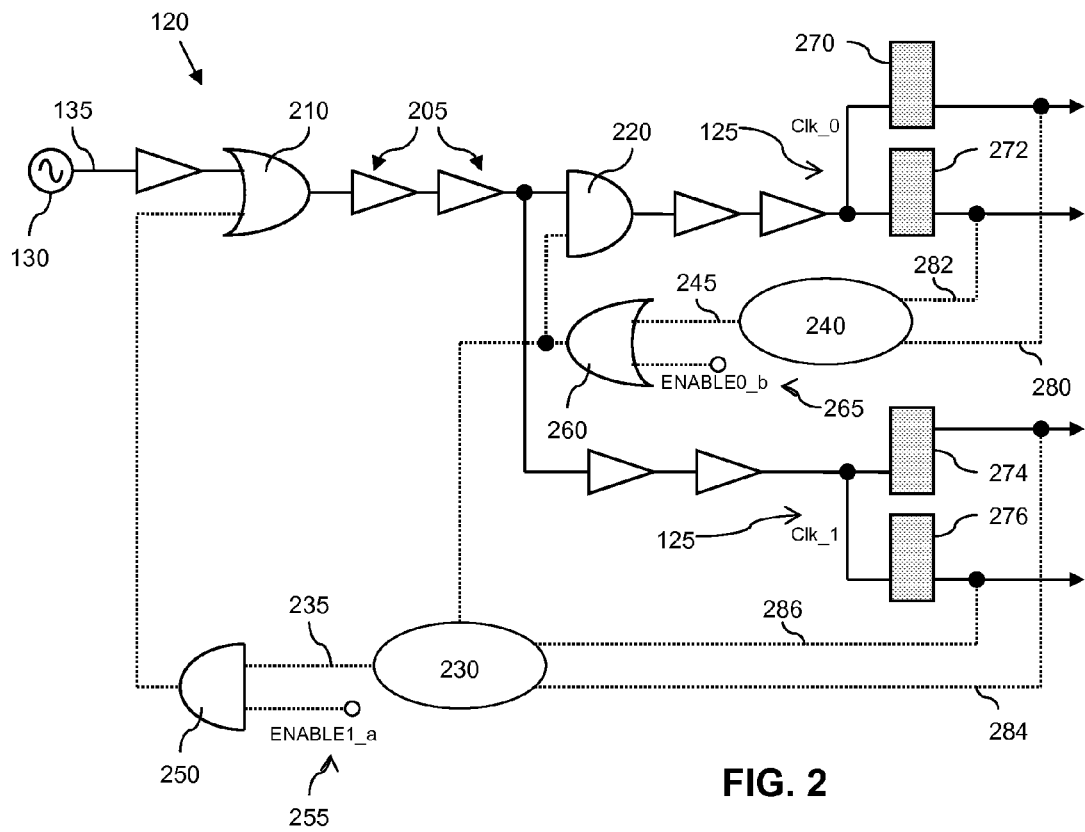
FIG. 2 illustrates an example of a part of the clock distribution network of FIG. 1.

Referring now to FIG. 2, an example of a part of clock distribution network 120 is illustrated in greater detail. Clock distribution network 120 comprises a network of delay components, for example comprising combinational logic elements, memory storage elements, etc; such components being arranged not only to distribute the received primary clock signal 135, but also to manipulate the received primary clock signal in order to generate derivative clock signals therefrom, for example by frequency dividing the primary clock signal 135 or the like. For the example illustrated in FIG. 2, such delay components are illustrated generally at 205. One part of the clock distribution network 120 illustrated in FIG. 2 is arranged to provide derivative clock signals, illustrated generally at 125, to functional elements comprising flip-flops 270, 272, 274, 276.

For the illustrated example, the clock gating circuitry comprises a first clock gating component 210 arranged to enable a first part of the clock distribution network 120 to be gated, and a second clock gating component 220 arranged to enable at least one further part of the clock distribution network to be gated. In particular, the second clock gating component 220 is arranged to enable that part of the clock distribution network 120 providing clock signals to first and second flip-flops 270, 272 to be gated. In this manner, that part of the clock distribution network providing clock signals to the first and second flip-flops 270, 272 may be disabled whilst the part of the clock distribution network providing clock signals to the third and fourth flip-flops 274, 276 may remain enabled. The first clock gating component 210 is arranged to enable that part of the clock distribution network 120 providing clock signals to all four of the flip-flops 270, 272, 274, 276 to be gated. In this manner, that part of the clock distribution network providing clock signals to all four flip-flops 270, 272, 274, 276 may be disabled.

The clock gating components 210, 220 illustrated in FIG. 2 comprise combinational logic gates. In particular, the first clock gating component 210 comprises an OR gate arranged to receive as inputs a clock signal for that part of the clock distribution network 120 and a clock gating control signal. Accordingly, when the clock gating control signal comprises a '0', or 'FALSE' value, the first clock gating component 210 effectively outputs the received clock signal for that part of the clock distribution network 120. Conversely, when the clock gating control signal comprises a '1', or 'TRUE' value, the output of the first clock gating component 210 is held at a '1', or 'TRUE' value, irrespective of the received clock signal for that part of the clock distribution network 120. In this manner, the clock signal is disabled for that part of the clock distribution network 120.

The second clock gating component 220 comprises an AND gate arranged to received as inputs a clock signal for that part of the clock distribution network 120 and a clock gating control signal. Accordingly, when the received clock gating control signal comprises a '1', or 'TRUE' value, the second clock gating component 220 effectively outputs the received clock signal for that part of the clock distribution network 120. Conversely, when the clock gating control signal comprises a '0', or 'FALSE' value, the output of the second clock gating component 220 is held at a '0', or 'FALSE' value, irrespective of the received clock signal for that part of the clock distribution network 120. In this manner, the clock signal is disabled for that part of the clock distribution network.

It will be appreciated that clock gating components are not limited to comprising combinational logic gates, and other forms of clock gating components may be used, such as flip-flops, etc. Furthermore, for the illustrated example, two different types of clock gating component are illustrated, namely an OR gate 210 and an AND gate 220, in order to demonstrate that clock gating may be implemented using a variety of types of clock gating components. However, it will be appreciated that typically a clock distribution network may comprise only a single type of clock gating component.

It will also be appreciated that the inclusion of such clock gating components within the clock distribution network affects the propagation of clock signals through those parts of the distribution network. In particular, such clock gating components may cause a slight delay to the propagation of the clock signals passing there through. Accordingly, such clock gating components may be considered as comprising delay components within the clock distribution network.

The clock gating circuitry further comprises gating control circuitry arranged to cause the gating components 210, 220 to disable their corresponding parts of the distribution network upon certain conditions being fulfilled. In particular for the illustrated example, the gating control circuitry comprises a first gating control module 230 arranged to output a clock gating control signal 235 for controlling the first gating component 210, and to configure the clock gating control signal 235 to cause the first gating component 210 to disable that part of the clock distribution network 120 providing clock signals to all four flip-flops 270, 272, 274, 276, upon certain conditions begin fulfilled. The gating control circuitry further comprises a second gating control module 240 arranged to output a clock gating control signal 245 for controlling the second gating component 220, and to configure the clock gating control signal 245 to cause the second gating component 220 to disable that part of the clock distribution network 120 providing clock signals to the first and second flip-flops 270, 272 upon certain conditions being fulfilled.

For the illustrated example, the clock gating control circuitry is arranged to receive one or more indication(s) of one or more internal states of one or more functional elements to which the clock distribution network provides a clock signal, illustrated generally at 115 in FIG. 1. The clock gating control circuitry is further arranged to cause the gating components 210, 220 to disable their respective parts of the clock distribution network 120, based at least partly upon the received indications fulfilling defined conditions. In particular for the illustrated example, the second clock gating control module 240 is arranged to receive output states of the first and second flip-flops 270, 272, and is arranged to configure the clock gating control signal 245 to cause the second gating component 220 to disable that part of the clock distribution network 120 that provides clock signals to the first and second flip-flop 270, 272 upon the output states of the first and second flip-flops 270, 272 fulfilling defined conditions. The first clock gating control module 230 is arranged to receive output states of the third and fourth flip-flops 274, 276. The first clock gating control module 230 is further arranged to receive an indication of whether that part of the clock distribution network 120 that provides clock signals to the first and second flip-flop 270, 272 has been disabled by way of the clock gating control signal 245 output by the second clock gating control module 240. The first clock gating control module 230 is further arranged to configure the clock gating control signal 235 output to cause the first gating component 210 to disable that part of the clock distribution network 120 providing clock signals to all four flip-flops 270, 272, 274, 276, upon the output states of both the third and fourth flip-flops 274, 276 and the clock gating control signal 245 output by the second clock gating module 240, fulfilling defined conditions.

The clock gating circuitry further comprises clock gating disabling circuitry configurable to enable the gating of one or more parts of the clock distribution network 120 to be disabled. In particular for the illustrated example, the clock gating disabling circuitry comprises clock gating disabling elements 250, 260 that are configurable to enable the gating of the clock distribution network 120 by the clock gating components 210, 220 to be disabled respectively. In this manner, the clock gating disabling elements 250, 260 may be configured to enable the gating of the clock distribution network 120 in order to allow power consumption of the integrated circuit device 100 to be reduced. Conversely, the clock gating disabling elements 250, 260 may be configured to disable the gating of the clock distribution network 120 in order to reduce any detrimental impact of clock gating on a performance of the integrated circuit device 100. Accordingly, the clock gating circuitry 140 may be dynamically configured to enable clock gating when reduced power consumption is of greater importance, or to disable clock gating when performance is of greater importance. As a result, the operation of the integrated circuit device 100 may be dynamically adapted between reduced power consumption and increased performance depending on the particular requirements.

For the illustrated example, the clock gating disabling elements 250, 260 comprise combinational logic gates. In particular, the first clock gating disabling element 250 comprises an AND gate arranged to receive as inputs the clock gating control signal 235 output by the first clock gating module 230, and a first clock gating enabling signal (ENABLE1_a) 255. The output of the first clock gating disabling element 250 is provided to an input of the first clock gating component 210. In this manner, when the first clock gating enabling signal 255 is set to a '1', or 'TRUE' value, the first clock gating disabling element 250 effectively outputs the clock gating control signal 235 output by the first clock gating module 230. Thus, the clock gating control signal 235 output by the first clock gating module 230 is received by the first clock gating component 210, and gating of the clock distribution network 120 providing clock signals to all four of the flip-flops 270, 272, 274, 276 is enabled. Conversely, when the first clock gating enabling signal (ENABLE1_a) 255 is set to a '0', or 'FALSE' value, the output of the first clock gating disabling element 250 is also maintained at a '0', or 'FALSE' value, irrespective of the clock gating control signal 235 output by the first clock gating module 230. For the illustrated example, the first clock gating component 210 comprises an OR gate. Accordingly, when the output of the first clock gating disabling element 250 is maintained at a '0', or 'FALSE' value, the first clock gating component 210 effectively outputs the received clock signal within that part of the clock distribution network 120. Thus, the clock gating control signal 235 output by the first clock gating module 230 is effectively overridden, and gating of the clock distribution network 120 providing clock signals to all four of the flip-flops 270, 272, 274, 276 is disabled. Thus, clock gating by the first clock gating component 210 is enabled when the first clock gating enabling signal (ENABLE1_a) is set to a '1' or 'TRUE' value.

For the illustrated example, the second clock gating disabling element 260 comprises an OR gate arranged to receive as inputs the clock gating control signal 245 output by the second clock gating module 240, and a second clock gating enabling signal (ENABLE0_b) 265. The output of the second clock gating disabling element 260 is provided to an input of the second clock gating component 220. In this manner, when the second clock gating enabling signal (ENABLE0_b) 265 is set to a '0', or 'FALSE' value, the second clock gating disabling element 260 effectively outputs the clock gating control signal 245 output by the second clock gating module 240. Thus, the clock gating control signal 245 output by the second clock gating module 240 is received by the second clock gating component 220, and gating of the clock distribution network 120 providing clock signals to the first and second flip-flops 270, 272 is enabled.

Conversely, when the second clock gating enabling signal (ENABLE0_b) 265 is set to a '1', or 'TRUE' value, the output of the second clock gating disabling element 260 is also maintained at a '1', or 'TRUE' value, irrespective of the clock gating control signal 245 output by the second clock gating module 240. For the illustrated example, the second clock gating component 220 comprises an AND gate. Accordingly, when the output of the second clock gating disabling element 260 is maintained at a '1', or 'TRUE' value, the second clock gating component 220 effectively outputs the received clock signal within that part of the clock distribution network 120. Thus, the clock gating control signal 245 output by the second clock gating control module 240 is effectively overridden, and gating of the of the clock distribution network 120 that provides clock signals to the first and second flip-flops 270, 272 is disabled. Thus, clock gating by the second clock gating component 220 is enabled when the second clock gating enabling signal (ENABLE0_b) is set to a '0' or 'FALSE' value.

For the illustrated example the first and second clock gating disabling elements 250, 260 may be controlled independently by way of independent configuration of the first and second clock gating enabling signals 255, 265. For example, referring back to FIG. 1, the functional block 110 of the integrated circuit device 100 may comprise a signal processing module 150 arranged to provide control and configuration signals 150 to the clock gating circuitry 140. Such control and configuration signals 155 may comprise, by way of example only, configuration information for the clock gating control modules 230, 240, and clock gating enabling signals 255, 265. In this manner, the clock gating disabling elements 250, 260 may be arranged to receive the clock gating enabling signals 255, 265 from the signal processing module 150, and to be independently configured thereby, such that some or all of the clock gating functionality provided by the clock gating circuitry 140 may be dynamically enabled/disabled by the signal processing module 150. For example, the signal processing module 150 may be arranged to dynamically configure the enabling/disabling of clock gating depending on particular application program code currently being executed thereby. Alternatively, in one example, the signal processing module 150 may be arranged to dynamically configure the enabling/disabling of clock gating dependent upon, say, operating frequency and/or supply voltage settings, temperature, process corners, etc. Alternatively still, in one example, the signal processing module 150 may be arranged to dynamically configure the enabling/disabling of clock gating dependent upon the processing load therefor. In one example, the dynamic configuration of the enabling/disabling of clock gating may be itself configurable, for example by way of values set within a register 160, or the like.

Referring now to FIGS. 3 and 4 there are illustrated examples of simplified flowcharts 300, 400 of a method for dynamically configuring clock gating such as may be implemented by the signal processing module 150 of FIG. 1. The method of FIG. 3 starts at step 310 and moves on to 320 where parts of a clock distribution network are identified for which clock gating is to be enabled. Next, at step 330, clock gating control signals corresponding to the identified parts of the clock distribution network are configured to enable clock gating. The configured clock gating control signals are then applied to respective clock gating disabling elements at step 340. The method then ends at step 350.

The method of FIG. 4 starts at step 410 and moves on to step 420 where parts of a clock distribution network are identified for which clock gating is to be disabled. Next, at step 430, clock gating control signals corresponding to the identified parts of the clock distribution network are configured to disable clock gating. The configured clock gating control signals are then applied to respective clock gating disabling elements at step 440. The method then ends at step 450.

Figure 5:
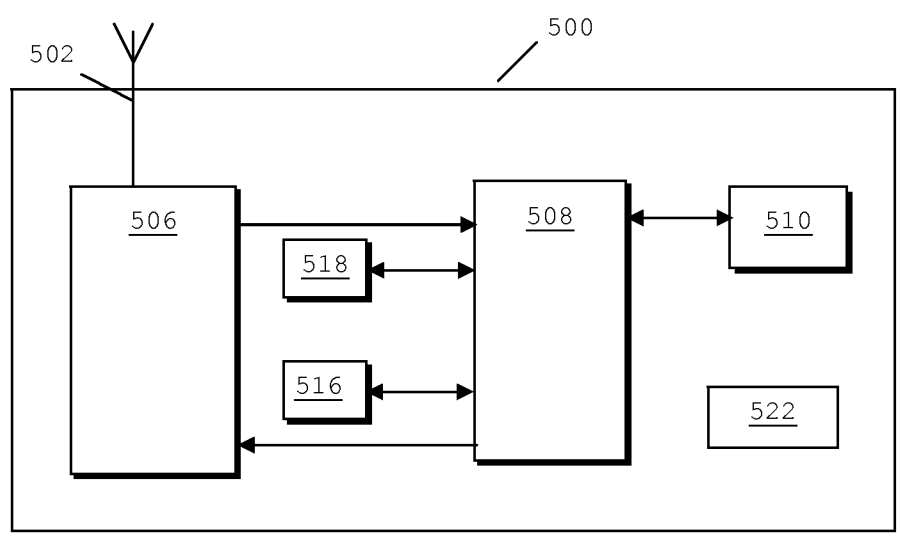
FIG. 5 illustrates an example of a simplified block diagram of part of an electronic device.

Referring to FIG. 5, there is illustrated an example of a simplified block diagram of part of an electronic device 500 that maybe adapted to support the aforementioned concept. The electronic device 500, in the context of the illustrated example, is a mobile telephone handset comprising an antenna 502. As such, the electronic device 500 contains a variety of well known radio frequency components or circuits 506, operably coupled to the antenna 502 that will not be described further herein. The electronic device 500 further comprises signal processing logic 508. An output from the signal processing logic 508 is provided to a suitable user interface (UI) 510 comprising, for example, a display, keypad, microphone, speaker etc.

For completeness, the signal processing logic 508 is coupled to a memory element 516 that stores operating regimes, such as decoding/encoding functions and the like and may be realised in a variety of technologies, such as random access memory (RAM) (volatile), (non-volatile) read only memory (ROM), Flash memory or any combination of these or other memory technologies. A timer 518 is typically coupled to the signal processing logic 508 to control the timing of operations within the electronic device 500.

As will be appreciated by a skilled artisan, the electronic device 500 comprises a plurality of synchronous digital components requiring a temporal reference. Accordingly, the electronic device further comprises at least one clock distribution network, illustrated generally at 522. In accordance with some examples the clock distribution network 522 comprises clock gating circuitry, such as the clock gating circuitry 140 of FIG. 1. The clock gating circuitry comprises at least one gating component located within the clock distribution network and arranged to enable at least one part of the clock distribution network to be gated, and gating control circuitry arranged to cause the at least one gating component to disable the at least one part of the clock distribution network upon certain conditions being fulfilled. The clock gating circuitry further comprises clock gating disabling circuitry configurable to enable the gating of the at least one part of the clock distribution network to be disabled.

In some examples, the invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner.

Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the signal processing module 150 of FIG. 1 is illustrated as forming a part of the function block 110 to which the clock distribution network 120 provides clock signals. However, it is contemplated that a signal processing module arranged to configure the enabling/disabling of clock gating may comprise a generally independent timing source.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device, as illustrated in the accompanying drawings. Alternatively, the examples may be implemented as any number of separate integrated circuits or separate devices interconnected with each other in a suitable manner. For example, the clock distribution network and functional block to which the clock distribution network provides clock signals may be distributed over a plurality of integrated circuit devices, and indeed may partially or entirely be located other than within an integrated circuit device, for example directly on/within a printed circuit board or the like.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising clock gating circuitry, wherein the clock gating circuitry comprises:
   a first clock gating component located within a clock distribution network and arranged to enable a first part of the clock distribution network to be gated;
   gating control circuitry arranged to cause the first clock gating component to disable the first part of the clock distribution network upon certain conditions being fulfilled;
   a first clock gating disabling element configurable to enable the first clock gating component to enable the gating of the first part of the clock distribution network, and to receive as inputs a first clock gating control signal and a first clock gating enable signal;
   a second clock gating component arranged to enable a second part of the clock distribution network to be gated; and
   a second clock gating disabling element arranged to enable the second clock gating component to enable the gating of the second part of the clock distribution network, and to receive as inputs a second clock gating control signal and a second clock gating enable signal.

2. The integrated circuit of claim 1 wherein the at least first clock gating disabling element includes a combinational logic element.

3. The integrated circuit of claim 1 wherein the first clock gating disabling element is arranged to receive the first clock gating enable signal from a signal processing module within a functional block to which the clock distribution network provides a clock signal.

4. The integrated circuit of claim 1 wherein the clock gating control circuitry is arranged to receive an indication of an internal state of a functional element to which the clock distribution network provides a clock signal.

5. The integrated circuit of claim 4 wherein the gating control circuitry is further arranged to cause the first gating component to disable the first part of the clock distribution network based at least partly upon the indication of the internal state of the functional element fulfilling a defined condition.

6. The clock gating circuitry of claim 5 wherein the gating control circuitry is further arranged to cause the first clock gating component to disable the first part of the clock distribution network based at least partly upon whether a second part of the clock distribution network has been disabled.

7. The integrated circuit of claim 1 further comprising:
a plurality of flip-flop circuits, wherein disabling the first clock gating component disables providing a clock signal to a first portion of the plurality of flip-flop circuits.

8. The integrated circuit of claim 7 wherein disabling the second clock gating component disables providing the clock signal to the entire plurality of flip-flop circuits.

9. A method for dynamically configuring clock gating, the method comprising:
identifying a first part of a clock distribution network for which clock gating is to be enabled/disabled;
configuring a first clock gating control signal corresponding to the identified first part of the clock distribution network to be enabled/disabled; and
applying the configured first clock gating control signal and a first clock gating enable signal to a first clock gating disabling element;
identifying a second part of the dock distribution network for which clock gating is to be enabled/disabled;
configuring a second clock gating control signal corresponding to the identified second part of the clock distribution network to be enabled/disabled; and
applying the configured second clock gating control signal and a second clock gating enable signal to a second clock gating disabling element.

10. The method of claim 9 wherein the first clock gating disabling element comprises a combinational logic element.

11. The method of claim 9 further comprising:
receiving, by the first clock gating disabling element, the first clock gating enable signal from a signal processing module within a functional block to which the clock distribution network provides a clock signal.

12. The method of claim 9 further comprising:
receiving an indication of an internal state of a functional element to which the clock distribution network provides a clock signal.

13. The method of claim 12 further comprising:
disabling, by the first clock gating component, the first part of the clock distribution network based at least partly upon the indication of the internal state of the functional element fulfilling the defined condition.

14. The method of claim 13 further comprising:
disabling, by the first clock gating component, the first part of the clock distribution network based at least partly upon whether the second part of the clock distribution network has been disabled.

15. An electronic device comprising clock gating circuitry; the clock gating circuitry comprising:
a first clock gating component located within a clock distribution network and arranged to enable a first part of the clock distribution network to be gated; and
gating control circuitry arranged to cause the first dock gating component to disable the first part of the clock distribution network upon certain conditions being fulfilled;
a first clock gating disabling element configured to enable the first clock gating component to enable the gating of the first part of the clock distribution network, and to receive as inputs a first clock gating control signal and a first clock gating enable signal; and
a second clock gating disabling element configured to enable gating of a second part of the clock distribution network, and to receive as inputs a second clock gating control signal and a second clock gating enable signal.

16. The device of claim 15 wherein the first clock gating disabling element comprises a combinational logic element.

17. The device of claim 15 wherein the first clock gating disabling element is arranged to receive the first clock gating enable signal from a signal processing module within a functional block to which the clock distribution network provides a clock signal.

18. The device of claim 15 wherein the gating control circuitry is arranged to receive an indication of an internal state of a functional element to which the clock distribution network provides a clock signal.

19. The device of claim 18 wherein the gating control circuitry is further arranged to cause the first clock gating component to disable the first part of the clock distribution network based at least partly upon the indication of the internal state of the functional element fulfilling the defined condition.

20. The device of claim 19 wherein the gating control circuitry is further arranged to cause the first clock gating component to disable the first part of the clock distribution network based at least partly upon whether the second part of the clock distribution network has been disabled.

* * * * *